United States Patent
Yamaki et al.

(10) Patent No.: US 11,443,829 B2
(45) Date of Patent: Sep. 13, 2022

(54) MEMORY SYSTEM HAVING NON-VOLATILE MEMORY

(71) Applicant: Kioxia Corporation, Tokyo (JP)

(72) Inventors: Ryo Yamaki, Kanagawa (JP); Yuki Komatsu, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/010,041

(22) Filed: Sep. 2, 2020

(65) Prior Publication Data
US 2021/0295943 A1   Sep. 23, 2021

(30) Foreign Application Priority Data
Mar. 19, 2020 (JP) .............................. JP2020-049985

(51) Int. Cl.
| | | |
|---|---|---|
| G11C 29/44 | (2006.01) | |
| G11C 29/52 | (2006.01) | |
| G06F 11/07 | (2006.01) | |
| G11C 29/50 | (2006.01) | |
| G11C 29/12 | (2006.01) | |

(52) U.S. Cl.
CPC ............ G11C 29/44 (2013.01); G06F 11/073 (2013.01); G06F 11/076 (2013.01); G11C 29/50004 (2013.01); G11C 29/52 (2013.01); G11C 2029/1202 (2013.01)

(58) Field of Classification Search
CPC ... G11C 29/44; G11C 29/50004; G11C 29/52; G11C 2029/1202; G06F 11/073; G06F 11/076
See application file for complete search history.

(56) References Cited

U.S. PATENT DOCUMENTS

| | | |
|---|---|---|
| 8,848,442 B2 | 9/2014 | Sharon |
| 8,879,325 B1 | 11/2014 | Bar |
| 9,431,118 B1 | 8/2016 | Bar |
| 10,216,422 B2 | 2/2019 | Kim |

FOREIGN PATENT DOCUMENTS

JP    2014-157647 A    8/2014

*Primary Examiner* — Vanthu T Nguyen
(74) *Attorney, Agent, or Firm* — Foley & Lardner LLP

(57) ABSTRACT

A memory system includes a non-volatile memory and a controller configured to divides an n-dimensional space into a plurality of regions by a plurality of hyperplanes, assign a representative point of a read level for reading data from a plurality of memory cells to each region, trace a branch node in the binary tree by determining whether a first read level is higher or lower than a voltage level at the branch node of the binary tree, determine a read level of a representative point assigned to a region correlated with a leaf node among the plurality of divided regions as a second read level corresponding to the first read level when reaching the leaf node of the binary tree by tracing the branch node in the binary tree, and cause the memory to read data of the cells by applying a voltage of the second read level.

20 Claims, 10 Drawing Sheets

MEMORY SYSTEM HAVING NON-VOLATILE MEMORY

CROSS-REFERENCE TO RELATED APPLICATION

This application is based upon and claims the benefit of priority from Japanese Patent Application No. 2020-049985, filed Mar. 19, 2020, the entire contents of which are incorporated here by reference.

FIELD

Embodiments described herein relate generally to a memory system.

BACKGROUND

Generally, multi-value data, which is data of a plurality of bits, is written to memory cells in a NAND flash memory. For example, a triple level cell (TLC) technique for writing 3-bit data to a memory cell and a quadruple level cell (QLC) technique for writing 4-bit data to a memory cell are commercialized.

The multi-value data written to the memory cell needs to be read at an appropriate read level. Since the number of read levels increases as the number of bits of the multi-value data increases, a method of compressing and recording a plurality of read levels is proposed. This method is called vector quantization.

In vector quantization, a multidimensional space is divided into a plurality of regions (subsets), representative points are assigned to each subset, and the plurality of regions obtained by dividing the multidimensional space are represented by a binary tree structure, a voltage level of each node of the binary tree structure is compared with a read level of a compression target, each node of the binary tree structure is traced in order, and thus, a representative point corresponding to the read level is determined when reaching a leaf node.

In the method described above, however, there is a possibility that a representative point different from an original representative point is selected in some cases.

DETAILED DESCRIPTION

At least one embodiment provides a memory system capable of improving accuracy when quantizing a read level.

In general, according to at least one embodiment, a memory system includes a non-volatile memory including a word line and a plurality of memory cells connected to the word line, and a controller configured to divide an n-dimensional (n is an integer of 2 or more) space into a plurality of regions by a plurality of hyperplanes, assign a representative point of a read level for reading data from a plurality of memory cells to each region, provide a binary tree for selecting any of the plurality of regions, trace a branch node in the binary tree by determining whether a first read level is higher or lower than a voltage level at the branch node of the binary tree, or is within a range of a voltage margin corresponding to the voltage level, determine a read level of a representative point assigned to a region correlated with a leaf node among the plurality of divided regions as a second read level corresponding to the first read level when reaching the leaf node of the binary tree by tracing the branch node in the binary tree, and cause the non-volatile memory to read data of the plurality of memory cells by applying a voltage of the determined second read level to the word line.

At least one embodiment of a memory system will be described below with reference to the drawings. Hereinafter, although a main configuration portion of the memory system will be mainly described, the memory system may have configuration portions or functions not illustrated or described. The following description does not exclude configuration portions or functions not illustrated or described.

First Embodiment

Figure 1:
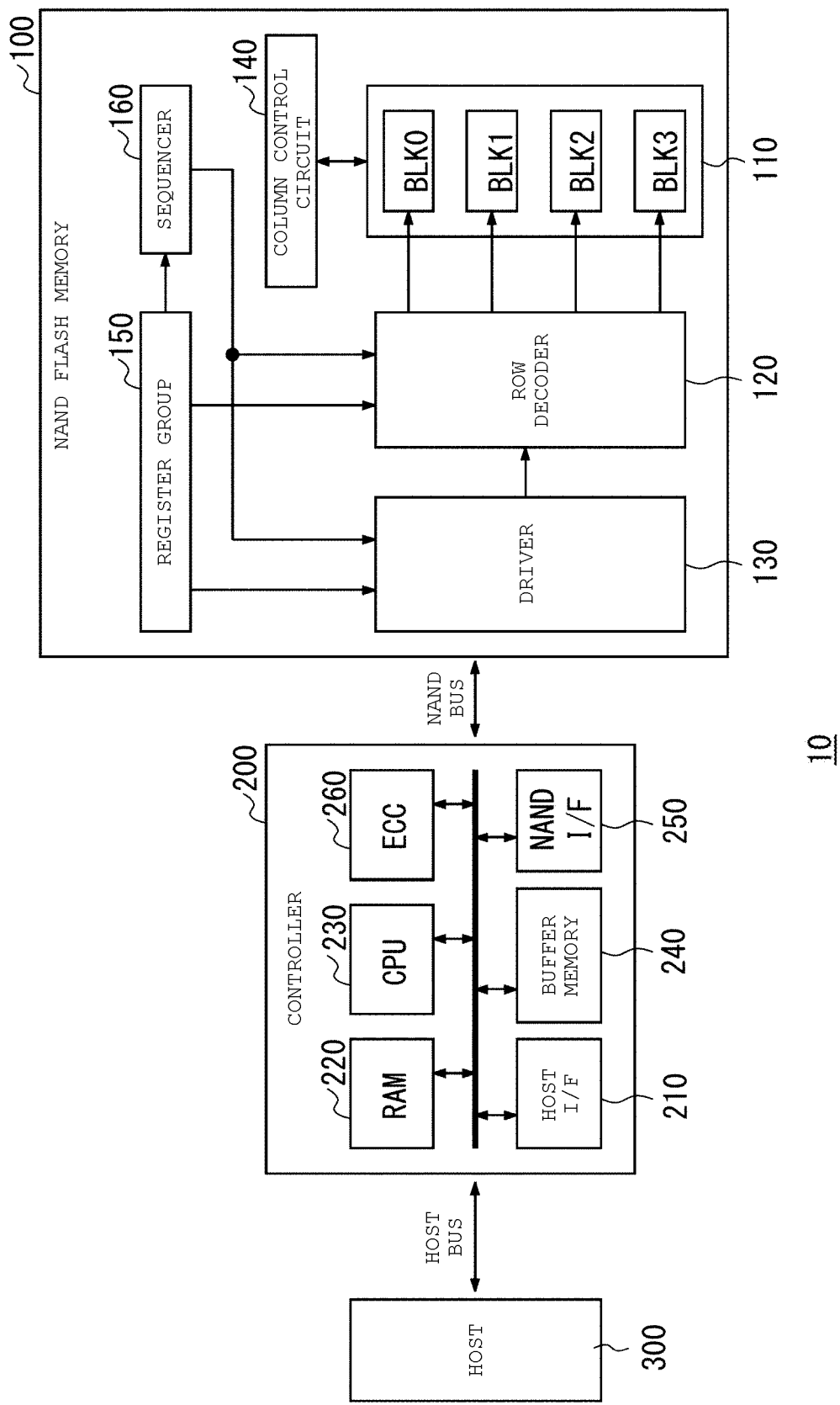
FIG. 1 is a block diagram illustrating a schematic configuration of a memory system according to a first embodiment.

FIG. 1 is a block diagram illustrating a schematic configuration of a memory system 10 according to a first embodiment. The memory system 10 includes a NAND flash memory 100 and a controller 200. The NAND flash memory 100 and the controller 200 may configure one semiconductor device by combining both, and examples thereof include a memory card such as an SD card and a solid state drive (SSD). Further, the controller 200 may be, for example, a system on chip (SoC) or the like.

The NAND flash memory 100 includes a plurality of memory cells and stores data in a non-volatile manner. The controller 200 is connected to the NAND flash memory 100 via a NAND bus and is connected to a host device 300 via a host bus. The controller 200 controls the NAND flash memory 100 and accesses the NAND flash memory 100 in response to a command received from the host device 300. The host device 300 may be, for example, a digital camera, a personal computer, or the like, and the host bus may be a bus according to, for example, an SDTM interface. The NAND bus transmits and receives signals according to a NAND interface.

The controller 200 includes a host interface circuit 210, an embedded memory (RAM) 220, a processor (CPU) 230, a buffer memory 240, a NAND interface circuit 250, and an error checking and correcting (ECC) circuit 260.

The host interface circuit 210 is connected to the host device 300 via the host bus, and transmits commands and data received from the host device 300 to the processor 230 and the buffer memory 240, respectively. Further, data in the buffer memory 240 is transmitted to the host device 300 in response to a command from the processor 230.

The processor 230 controls the overall operation of the controller 200. For example, when receiving a write command from the host device 300, the processor 230 issues a write command to the NAND interface circuit 250 in response thereto. The same applies when performing read and erasure. Further, the processor 230 performs various types of processing, such as wear leveling, for managing the NAND flash memory 100. An operation of the controller 200 described below may be performed by a CPU executing firmware or may be performed by hardware.

The NAND interface circuit 250 is connected to the NAND flash memory 100 via the NAND bus and controls communication with the NAND flash memory 100. The NAND interface circuit 250 transmits and receives various signals to and from the NAND flash memory 100 based on a command received from the processor 230.

The buffer memory 240 temporarily stores write data and read data.

The embedded memory 220 is a semiconductor memory such as DRAM or SRAM and is used as a work area of the processor 230. The embedded memory 220 stores firmware for managing the NAND flash memory 100, various management tables, and so on.

The ECC circuit 260 performs error detection and error correction processing for the data stored in the NAND flash memory 100. That is, the ECC circuit 260 generates an error correction code when writing data, adds the error correction code to the write data, and decodes the error correction code when reading the data.

Next, a configuration of the NAND flash memory 100 will be described. As illustrated in FIG. 1, the NAND flash memory 100 includes a memory cell array 110, a row decoder 120, a driver circuit 130, a column control circuit 140, a register group 150, and a sequencer 160.

The memory cell array 110 includes a plurality of blocks BLK including a plurality of non-volatile memory cells correlated with rows and columns. In FIG. 1, four blocks BLK0 to BLK3 are illustrated as an example. The memory cell array 110 stores data given from the controller 200.

The row decoder 120 selects any of the blocks BLK0 to BLK3 and further selects a row direction of the selected block BLK.

The driver circuit 130 supplies a voltage to the selected block BLK via the row decoder 120.

The column control circuit 140 senses data read from the memory cell array 110 when reading the data, and performs a necessary calculation. Then, the data DAT is output to the controller 200. When writing data, write data DAT received from the controller 200 is transmitted to the memory cell array 110.

The register group 150 includes an address register, a command register, and so on. The address register stores an address received from the controller 200. The command register stores a command received from the controller 200.

The sequencer 160 controls the overall operation of the NAND flash memory 100 based on various types of information stored in the register group 150.

Figure 2:
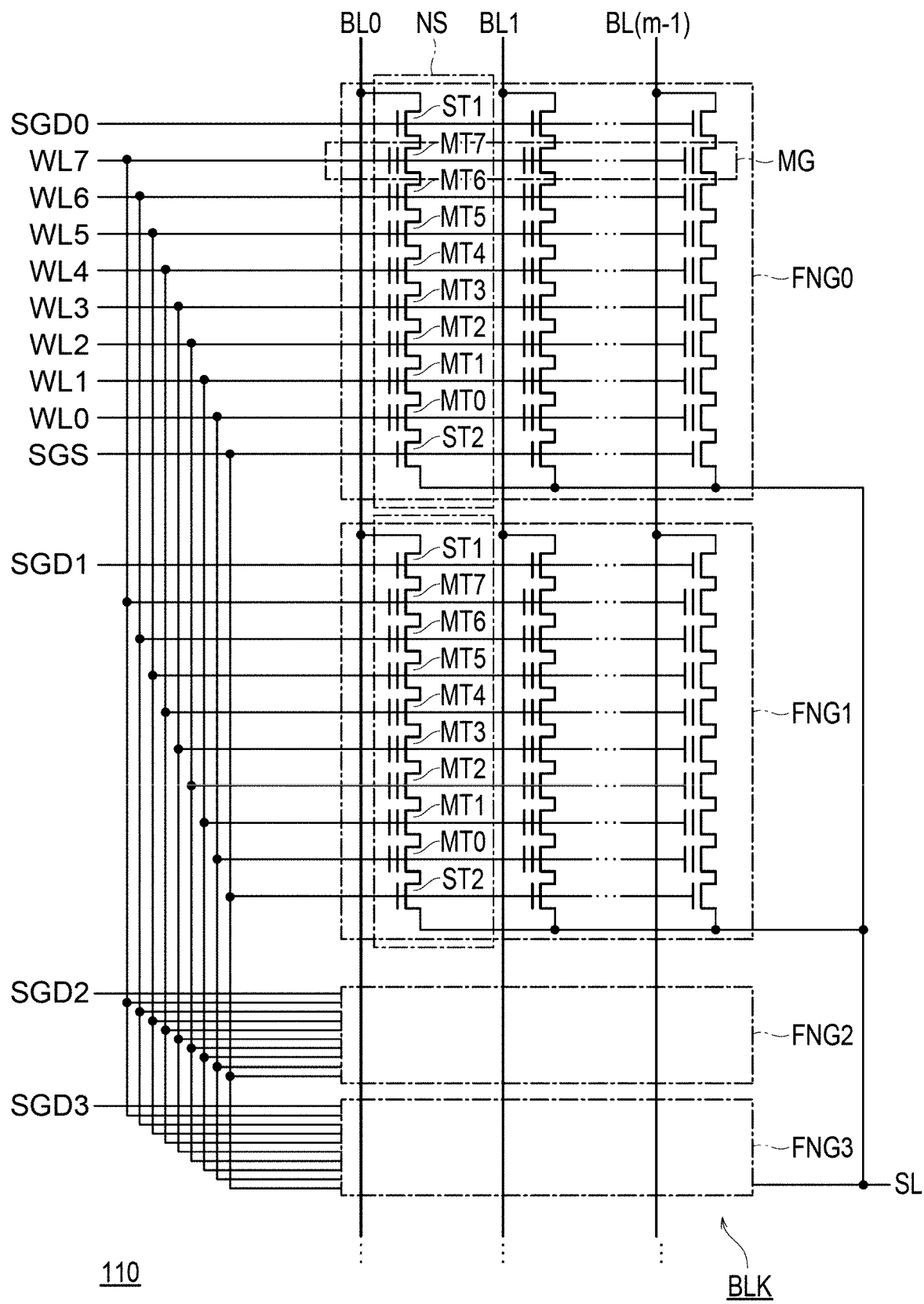
FIG. 2 is a circuit diagram illustrating an example of a NAND memory cell array having a three-dimensional structure.

FIG. 2 is a circuit diagram illustrating an example of the NAND memory cell array 110 having a three-dimensional structure. FIG. 2 illustrates a circuit configuration of one block BLK of a plurality of blocks in the NAND memory cell array 110 having a three-dimensional structure. The other blocks of the NAND memory cell array 110 also have the same circuit configuration as in FIG. 2. At least one embodiment is also applicable to a memory cell having a two-dimensional structure.

As illustrated in FIG. 2, the block BLK includes, for example, four fingers FNG (FNG0 to FNG3). Further, each of the fingers FNG includes a plurality of NAND strings NS. Each of the NAND strings NS includes, for example, eight memory cell transistors MT (MT0 to MT7) connected in cascade and select transistors ST1 and ST2. In the present specification, each of the fingers FNG may be referred to as a string St.

The number of memory cell transistors MT in the NAND string NS is not limited to 8, however. The memory cell transistors MT are arranged between the select transistors ST1 and ST2 such that current paths thereof are connected in series. The current path of the memory cell transistor MT7 on one end side of the series connection is connected to one end of a current path of the select transistor ST1, and the current path of the memory cell transistor MT0 on the other end side is connected to one end of a current path of the select transistor ST2.

Gates of the select transistors ST1 of the fingers FNG0 to FNG3 are commonly connected to the select gate lines SGD0 to SGD3, respectively. Meanwhile, gates of the select transistors ST2 are commonly connected to the same select gate line SGS between the plurality of fingers FNG. Further, control gates of the memory cell transistors MT0 to MT7 in the same block BLK are commonly connected to word lines WL0 to WL7, respectively. That is, the word lines WL0 to WL7 and the select gate line SGS are commonly connected between the plurality of fingers FNG0 to FNG3 in the same block BLK, whereas the select gate lines SGD are independent for each of the fingers FNG0 to FNG3 even in the same block BLK.

The word lines WL0 to WL7 are connected to control gate electrodes of the memory cell transistors MT0 to MT7 configuring the NAND string NS, respectively. The i-th memory cell transistors MTi (i=0 to n) in each NAND string NS in the same finger FNG are commonly connected to the same word line WLi (i=0 to n). That is, the control gate electrodes of the memory cell transistors MTi on the same row in the block BLK are connected to the same word line WLi.

Each NAND string NS is also connected to the word lines WLi and bit lines. Each memory cell in each NAND string NS can be identified by an address for identifying the word lines WLi and the select gate lines SGD0 to SGD3 and an address for identifying the bit lines. As described above, data of the memory cells (memory cell transistors MT) in the same block BLK are collectively erased. Meanwhile, reading and writing of data are performed in units of physical sectors MS. One physical sector MS is connected to one word line WLi and includes a plurality of memory cells in one finger FNG.

The controller 200 performs writing (programming) in units of all NAND strings NS connected to one word line in one finger. Therefore, units of the amount of data programmed by the controller 200 are 4 bits×the number of bit lines.

During a read operation and a program operation, one word line WLi and one select gate line SGD are selected and the physical sector MS is selected according to a physical address. In the present specification, writing data to a memory cell is referred to as programming as appropriate.

Figure 3:
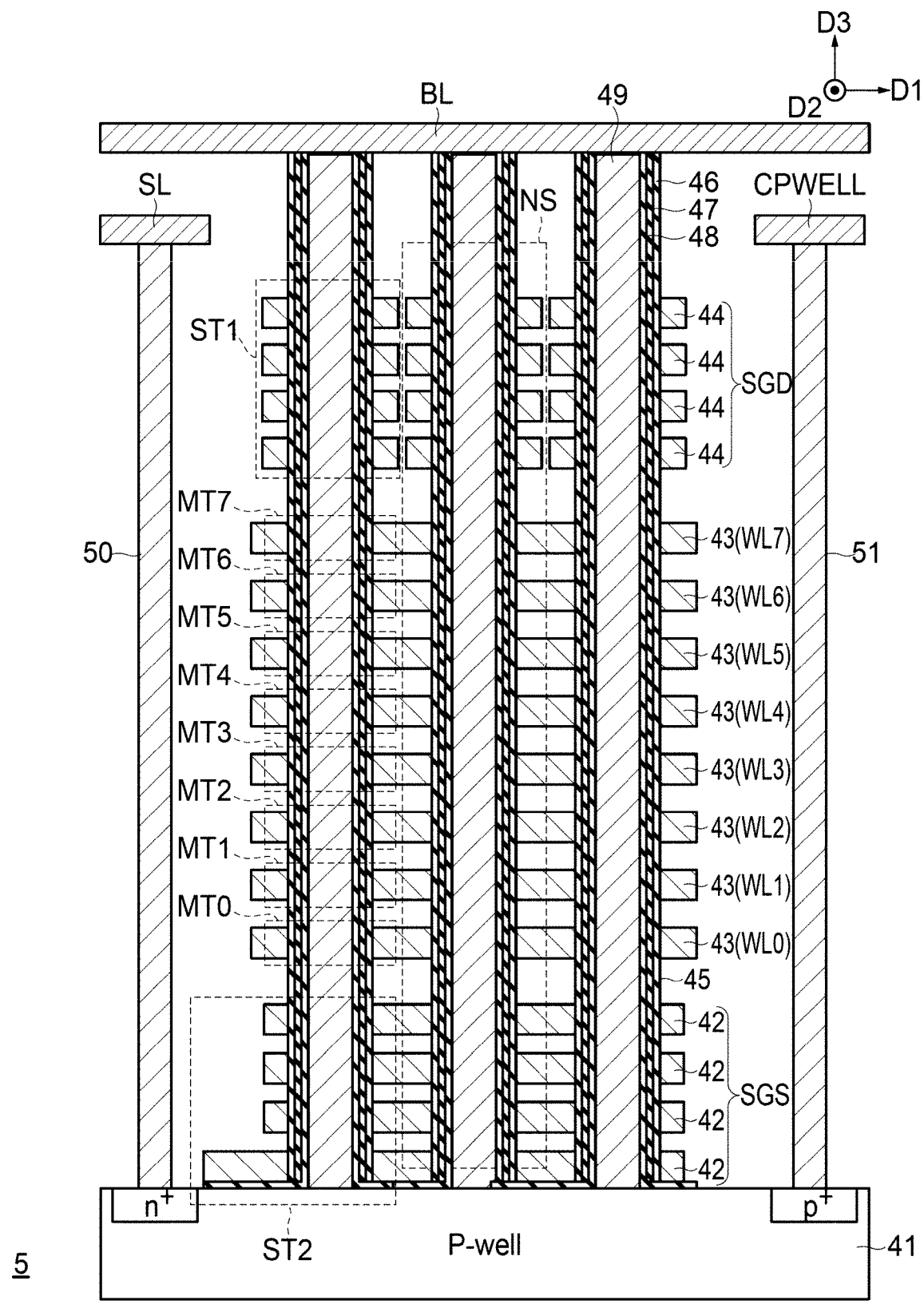
FIG. 3 is a cross-sectional view of a partial region of a NAND memory cell array of a NAND memory having a three-dimensional structure according to at least one embodiment.

FIG. 3 is a cross-sectional view of a partial region of the NAND memory cell array 110 in the NAND flash memory 100 having a three-dimensional structure. As illustrated in FIG. 3, a plurality of NAND strings NS are vertically formed on a p-type well region (P-well) 41 of a semiconductor substrate. That is, a plurality of wiring layers 42 functioning as the select gate lines SGS, a plurality of wiring layers 43 functioning as the word lines WLi, and a plurality of wiring layers 44 functioning as the select gate lines SGD are vertically formed on the p-type well region 41.

Memory holes 45 penetrating the wiring layers 42, 43, and 44 to reach the p-type well region 41 are formed. A block insulating film 46, a charge storage layer 47, and a gate insulating film 48 are sequentially formed on a side surface of the memory hole 45, and a conductive film 49 is buried in the memory hole 45. The conductive film 49 functions as a current path of the NAND string NS and is a region where a channel is formed when the memory cell transistor MT and the select transistors ST1 and ST2 operate.

In each NAND string NS, the select transistor ST2, the plurality of memory cell transistors MT, and the select transistor ST1 may be sequentially stacked on the p-type well region 41. A wiring layer functioning as the bit line BL is formed on an upper portion of the conductive film 49.

Further, an $n^+$-type impurity diffusion layer and a $p^+$-type impurity diffusion layer are formed in a surface of the p-type well region 41. A contact plug 50 is formed on the $n^+$-type impurity diffusion layer, and a wiring layer functioning as a source line SL is formed on the contact plug 50. A contact plug 51 is formed on the $p^+$-type impurity diffusion layer, and a wiring layer functioning as a well wire CPWELL is formed on the contact plug 51. The well wire CPWELL is used to apply an erasure voltage.

A plurality of NAND memory cell arrays 110 illustrated in FIG. 3 are arranged in a depth direction into the paper of FIG. 3, and one finger FNG is formed by a set of a plurality of NAND strings NS arranged in a line in the depth direction. The other fingers FNG are formed, for example, in the left-right direction of FIG. 3. Although FIG. 2 illustrates four fingers FNG0 to FNG3, FIG. 3 illustrates an example in which three fingers are arranged between the contact plugs 50 and 51.

Figure 4:
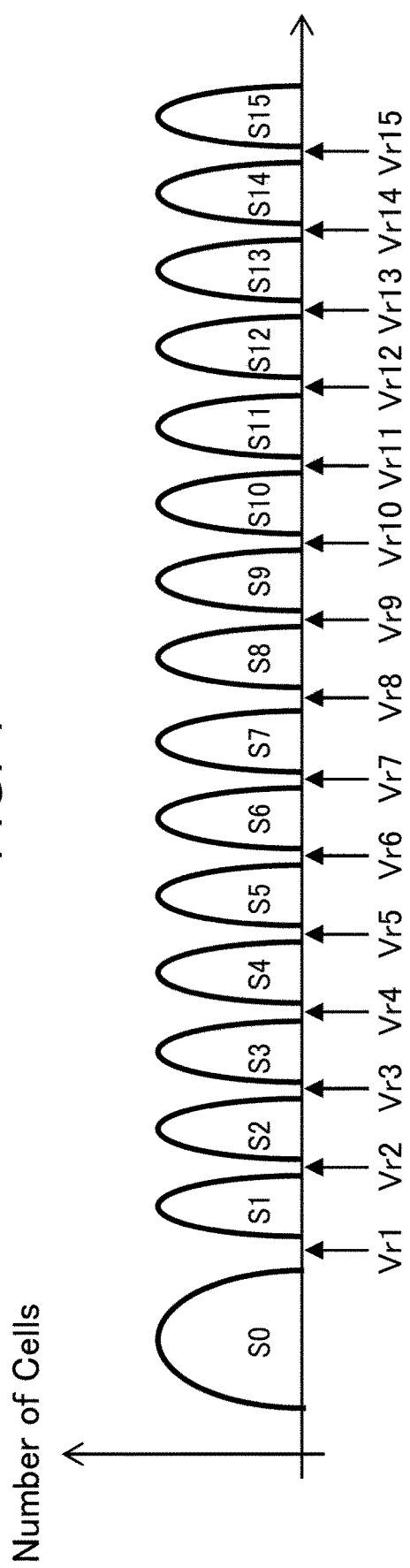
FIG. 4 is a diagram illustrating an example of a threshold voltage region according to the first embodiment.

FIG. 4 is a diagram illustrating an example of a threshold value distribution of the memory cell transistors MT in the memory system according to at least one embodiment. FIG. 4 illustrates an example of a distribution of a threshold voltage region of a non-volatile memory of four bits/cells. In the non-volatile memory, information is stored by the charge amount of electrons stored in the charge storage layer 47 of the memory cell. Each memory cell has a threshold voltage in accordance with the charge amount of electrons. A plurality of data values stored in the memory cell are made to correspond to a plurality of regions (threshold voltage regions) having different threshold voltages, respectively.

S0 to S15 of FIG. 4 indicate threshold value distributions within 16 threshold voltage regions. A horizontal axis of FIG. 4 represents the threshold voltage, and a vertical axis represents the number of memory cells (the number of cells). The threshold value distribution is a range in which thresholds change. As such, each memory cell has 16 threshold voltage regions partitioned by 15 boundaries, and each threshold voltage region has a unique threshold value distribution.

In FIG. 4, a region where the threshold voltage is Vr1 or lower is called a region S0, a region where the threshold voltage is higher than Vr1 and lower than or equal to Vr2 is called a region S1, and a region where the threshold voltage is higher than Vr2 and lower than or equal to Vr3 is called a region S2, and a region where the threshold voltage is higher than Vr3 and lower than or equal to Vr4 is called a region S3. Further, in at least one embodiment, a region where the threshold voltage is higher than Vr4 and lower than or equal to Vr5 is called a region S4, a region where the threshold voltage is higher than Vr5 and lower than or equal to Vr6 is called a region S5, and a region where the threshold voltage is higher than Vr6 and lower than or equal to Vr7 is called a region S6, and a region where the threshold voltage is higher than Vr7 and lower than or equal to Vr8 is called a region S7. Further, in at least one embodiment, a region where the threshold voltage is higher than Vr8 and lower than or equal to Vr9 is called a region S8, a region where the threshold voltage is higher than Vr9 and lower than or equal to Vr10 is called a region S9, and a region where the threshold voltage is higher than Vr10 and lower than or equal to Vr11 is called a region S10, and a region where the threshold voltage is higher than Vr11 and lower than or equal to Vr12 is called a region S11. Further, in at least one embodiment, a region where the threshold voltage is higher than Vr12 and lower than or equal to Vr13 is called a region S12, a region where the threshold voltage is higher than Vr13 and lower than or equal to Vr14 is called a region S13, and a region where the threshold voltage is higher than Vr14 and lower than or equal to Vr15 is called a region S14, and a region where the threshold voltage is higher than Vr15 and lower than or equal to Vr16 is called a region S15.

Further, threshold value distributions corresponding to the regions S0 to S15 are called first to sixteenth distributions, respectively. Vr1 to Vr15 are threshold voltages that serve as boundaries between the respective threshold voltage regions.

In a non-volatile memory such as the NAND flash memory 100, a plurality of data values are respectively made to correspond to a plurality of threshold voltage regions of a memory cell. This correspondence is called data coding. The data coding is determined previously, and when writing (programming) data, charges are injected into the charge storage layer 47 in the memory cell so as to be in the threshold voltage region in accordance with the data value to be stored according to the data coding. When reading data, a read voltage is applied to the memory cell, and a logic of the data is determined depending on whether a threshold value of the memory cell is lower or higher than the read voltage.

When reading data, the logic of data is determined depending on whether the threshold value of a memory cell of a read target is lower or higher than a read level at a boundary of the read target. When the threshold is the lowest, the data is in an "erasure" state, and data of all bits is defined as "1". When the threshold is higher than the "erasure" state, the data is in a "programming" state and the data is defined as "1" or "0" according to the coding.

The controller 200 according to at least one embodiment performs a vector quantization of a read level. It is assumed that the read level is set previously, for example, by repeatedly writing and reading data in the memory cell to determine a minimum bit error rate. In the vector quantization, a read level is converted into a voltage level at a representative point of a plurality of regions (subsets) obtained by dividing a multidimensional space.

A threshold voltage of the memory cell transistor is changed by a factor such as disturb. In some cases, a distribution width of the threshold voltage distribution illustrated in FIG. 4 is increased or the threshold voltage distribution moves. Thereby, adjacent threshold voltage distributions overlap each other.

As such, when the threshold voltage distribution of the memory cell transistor changes from the initially set value, the ECC circuit 260 is not able to correctly correct the data read by using the set read level in some cases. In this case, the controller 200 shifts the set read level and performs a read operation of data again. This is called shift read. Further, the controller 200 may also use a Vth tracking operation to determine the read voltage. The Vth tracking operation is an operation of searching for a voltage corresponding to an intersection of overlapping threshold value distributions by measuring the number of on cells (or off cells) while finely changing the read voltage. The controller 200 determines an optimum read voltage based on the intersection. When the controller 200 sets the read voltage shifted by a shift read from the set read level or the read voltage determined by the Vth tracking operation to a new read level instead of the set read level, search processing, which will be described below, is performed to determine a second read level as a representative point corresponding to a new read level which is set as a first read level.

As will be described below, the controller 200 according to at least one embodiment divides an n-dimensional (n is an integer of 2 or more) space into a plurality of regions by a plurality of hyperplanes, assigns a representative point of a read level for reading data from a plurality of memory cells to each area, and provides a binary tree for selecting one of the plurality of regions. The controller 200 traces the branch node in the binary tree by determining whether the first read level is higher or lower than a voltage level at a branch node of the binary tree, or is within a range of a voltage margin corresponding to the voltage level. When reaching a leaf node of the binary tree by tracing the branch node in the binary tree, the controller 200 determines the read level of the representative point assigned to the region correlated with the leaf node among the plurality of divided regions as the second read level corresponding to the first read level. The controller 200 causes the NAND flash memory 100 to read data of the plurality of memory cells by applying a voltage of the determined second read level to the word line.

The controller 200 may adjust a voltage width of a voltage margin M according to a bit error rate when reading data from the NAND flash memory 100.

When the first read level exceeds a range of the voltage margin M to be higher or lower than the voltage level of the branch node, the controller 200 repeats processing of comparing the first read level with the voltage level of the branch node in a descending order from the branch node on an upper side according to the binary tree. When reaching the leaf node of the binary tree, the controller 200 determines the read level of the representative point assigned to the region correlated with the leaf node as the second read level.

When it is determined that a voltage difference between the first read level and the voltage level of the branch node is within the voltage margin M, the controller 200 performs comparison with the first read level for all the branch nodes on a lower side of the binary tree from the branch node determined to be within the voltage margin M.

The controller 200 may have a node storing unit (node storage) that stores the branch node each time a new branch node is searched according to the binary tree. The controller 200 performs a voltage comparison with the first read level in order from the branch node stored most recently among the branch nodes stored by the node storing unit (step S8 of FIG. 9 described below).

The controller 200 may perform a voltage comparison with the first read level in order from the branch node stored most recently until there are no branch nodes stored in the node storing unit.

When performing a voltage comparison between the voltage level of the branch node stored in the node storing unit and the first read level, the controller 200 provides the voltage margin M for changing determination criteria and then, may determine whether the first read level is higher or lower than the voltage level of the branch node, or is within a range of the voltage margin M.

When the leaf node in the binary tree is searched, the controller 200 calculates a distance between a representative point in a region corresponding to the leaf node and the first read level, and may determine the read level of the representative point of the leaf node having the smallest distance as the second read level.

The controller 200 may stop searching from the branch node to the branch node on the lower side of the binary tree for the branch node whose voltage difference with the first read level is higher than or equal to a predetermined value.

The controller 200 according to at least one embodiment performs, for example, 4-bit multi-value writing, and in the 4-bit multi-value writing, 255 representative points are provided, for example, in a 15-dimensional space as candidates of the read level. For the sake of simplicity, a method of searching the representative point of the read level from the two-dimensional space will be described hereinafter.

Each processing of the controller 200 and the node storing unit is performed by, for example, a CPU in the controller 200 illustrated in FIG. 1.

Figure 5:
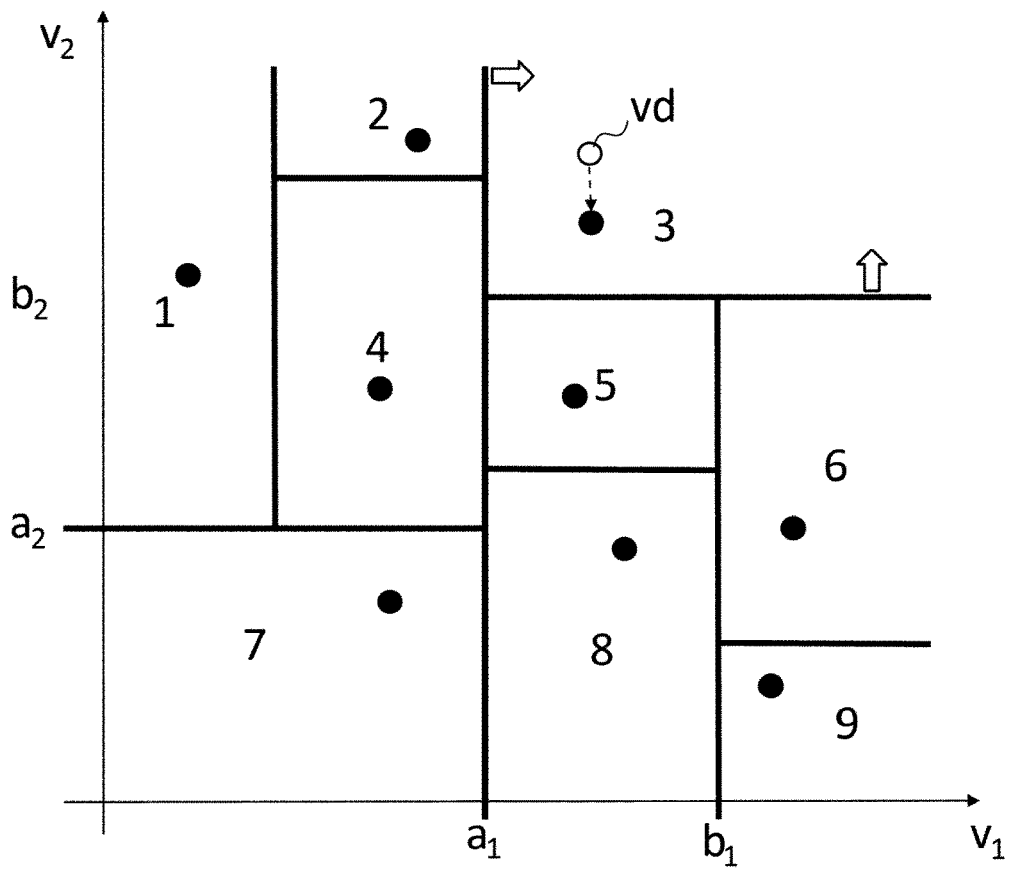
FIG. 5 is a diagram illustrating a state where a plane is divided by a plurality of straight lines orthogonal to two axes, according to at least one embodiment.
Figure 6:
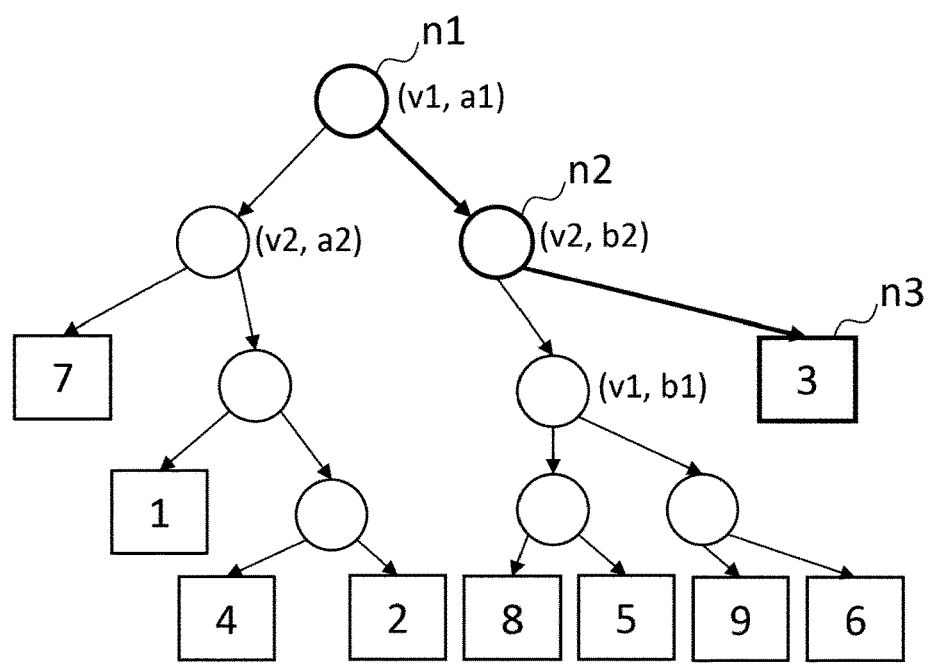
FIG. 6 is a diagram illustrating a binary tree corresponding to a plurality of regions, according to at least one embodiment.

FIG. 5 illustrates a two-dimensional space, that is, a state in which a plane is divided by a plurality of straight lines orthogonal to two axes $v_1$ and $v_2$. A representative point is assigned to each of a plurality of regions (subsets) generated by the division. In FIG. 5, the representative point of each region is represented by a black circle. A number beside the representative point is an identification number of each region. FIG. 6 is a diagram illustrating a binary tree corresponding to a plurality of regions. The binary tree in FIG. 6 includes two types of nodes of a node represented by a circle and a node represented by a square. The circle node is called a branch node because the node is branched into two, and the square node is called a leaf node because the node is a dead end. As illustrated in FIG. 6, the branch node always includes two child nodes. That is, the branch node branches into one of the two child nodes.

The branch node represented by a circle in FIG. 6 has anode number, a dimension used to determine a branch direction of the node, a threshold for determining the branch direction, a left node number, and aright node number. Further, the leaf node represented by the square in FIG. 6 has a node number and a codebook entry number. Whether a certain node is a leaf node or a branch node can be discriminated by the number of data stored in each node, the node number, a flag indicating the type of node, or the like. In the following description, the branch node and the leaf node may be collectively referred to simply as a node.

In vector quantization, processing of correlating each read level with one of the representative points is performed. Here, as illustrated in FIG. 5, a method of determining the representative point when a first read level vd of a compression target is input will be described. $a_1$, $a_2$, $b_1$, and $b_2$ in FIG. 5 are thresholds for determining a branch direction. The first read level vd is located on the right side of the straight line represented by $v_1=a_1$ when viewed from the v1 axis in FIG. 5. In FIG. 6, a straight line represented by $v_1=a_1$ is a node n1. Since the first read level vd is located on the right side of $v_1=a_1$, the node n2 on the right side connected to the node n1 in FIG. 6 is selected as a search target.

The first read level vd is located above the straight line represented by $v_2=b_2$ when viewed from the v2 axis in FIG. 5. Therefore, a node n3 on the right side connected to the node n2 in FIG. 6 is selected as the search target.

Since the node n3 is a leaf node and has no child node, an entry number "3" of the leaf node is selected. The entry number is correlated with one of the representative points, and a correspondence relationship between the entry number and the representative point is recorded in a codebook managed by the controller 200. Thus, if the entry number is known, the corresponding representative point can be specified by referring to the codebook. The codebook may be stored in the controller 200 or may be stored in a memory unit accessible by the controller 200.

The first read level vd and the voltage level of the representative point do not necessarily match and are expected to be close values. When the read level vd and the voltage level of the corresponding representative point are separated from each other by a certain level or more, a bit error rate may increase.

As illustrated in FIGS. 5 and 6, a representative point is set in each of a plurality of regions (subsets) obtained by dividing a multidimensional space into a plurality of axes for each dimension, and each node configuring a binary tree is traced in order, and thus, the representative point of the subset corresponding to the first read level vd can be searched.

However, when the first read level vd exists near a division boundary that divides the multidimensional space, determination may be erroneous depending on whether the branch node moves to the right child node or the left child node, and as a result, there is a possibility of being correlated with an incorrect representative point.

Figure 7:
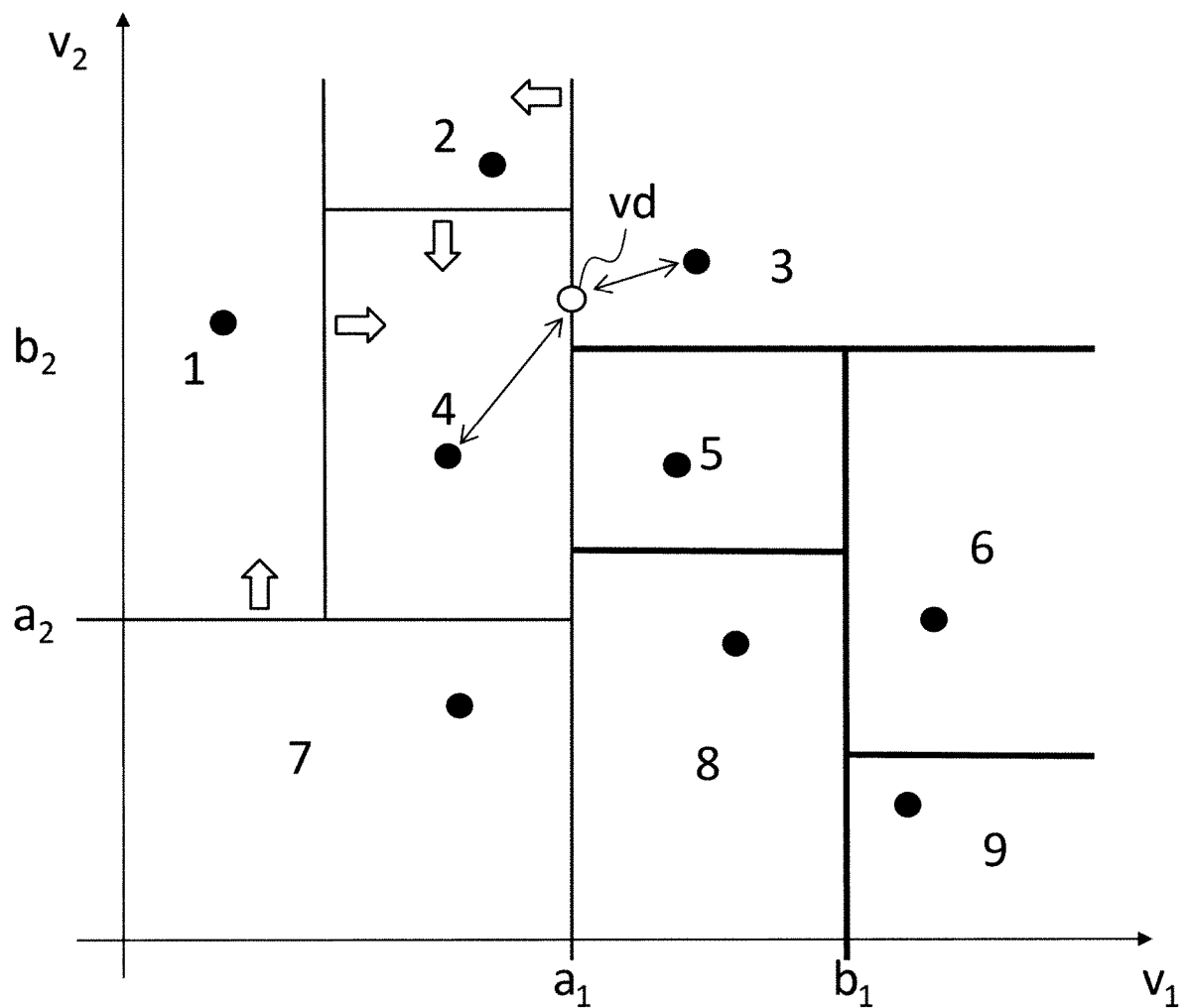
FIG. 7 is a diagram illustrating an example in which a new read level is located on a straight line represented by $v_1 = a_1$, according to at least one embodiment.
Figure 8:
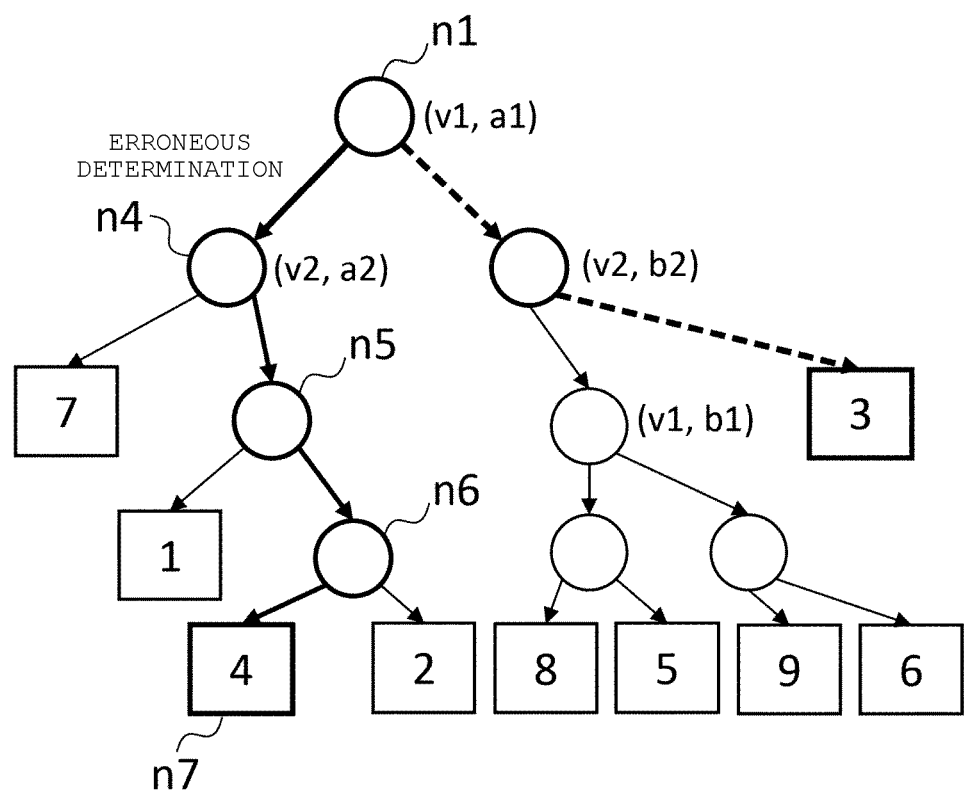
FIG. 8 is a diagram illustrating a binary tree corresponding to FIG. 7, according to at least one embodiment.

FIGS. 7 and 8 illustrate an example in which the first read level vd is located on the straight line represented by $v_1=a_1$. In this case, there is a possibility that the first read level vd is erroneously determined to be located on the left side of the straight line represented by $v_1=a_1$ when viewed from the v1 axis in FIG. 7. In this case, a node n4, which is a child node on the left side of the node n1 in the binary tree of FIG. 8, is selected as a search target. Thereafter, nodes n5 and n6 illustrated as a bold line in FIG. 8 are selected in order as search targets, and a leaf node n7 of an entry number "4" is reached.

As can be seen by comparing FIG. 7 and FIG. 5, although the first read level vd is closer to the representative point of the entry number "3", the representative point of the entry number "4" is correlated.

In at least one embodiment, measures are taken to prevent the abnormality described with reference to FIGS. 7 and 8 from occurring.

Figure 9:
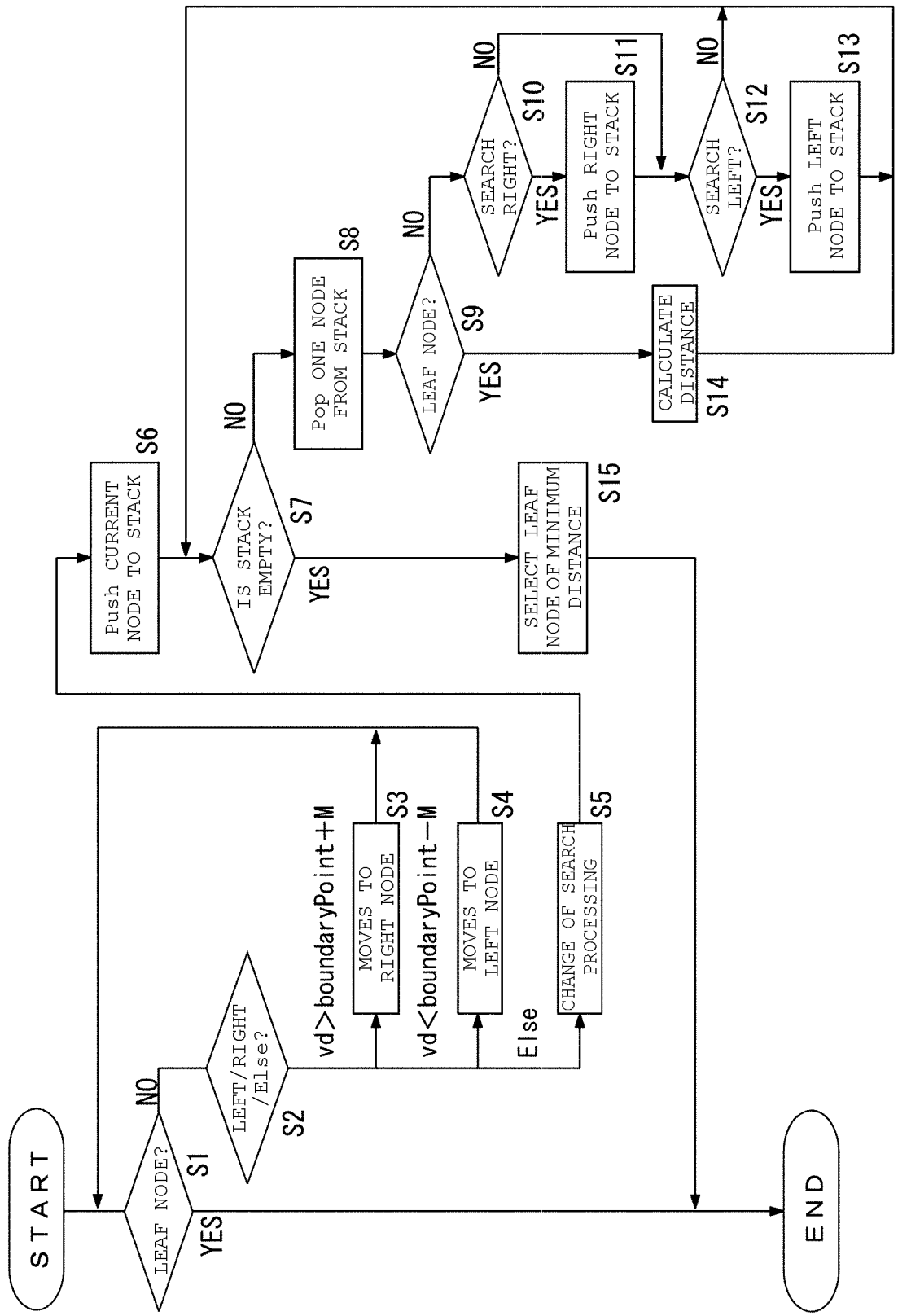
FIG. 9 is a flowchart illustrating an example of representative point search processing performed by a controller, according to at least one embodiment.
Figure 10:
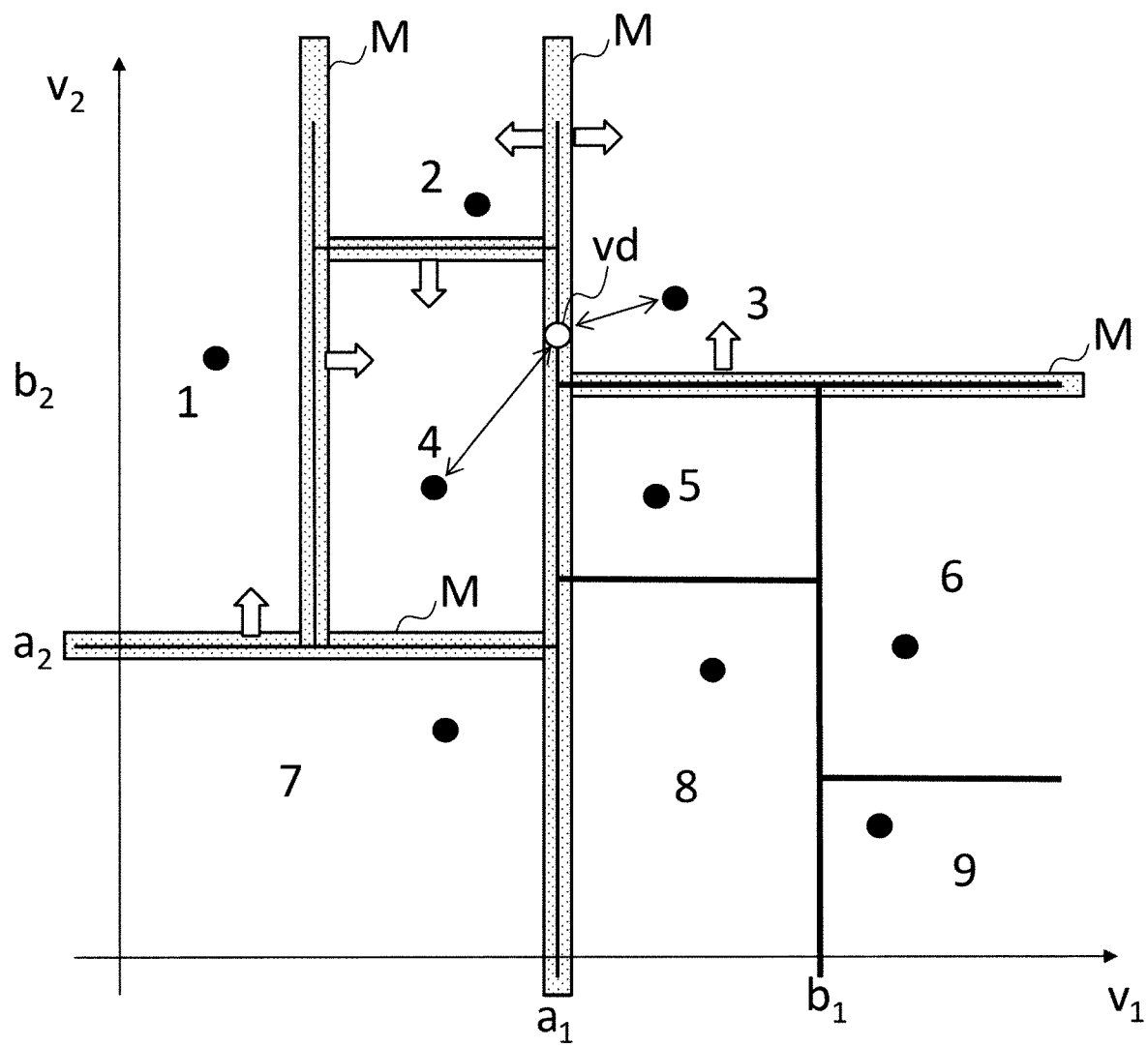
FIG. 10 is a diagram illustrating an example in which a two-dimensional space is divided into a plurality of regions, according to at least one embodiment.
Figure 11:
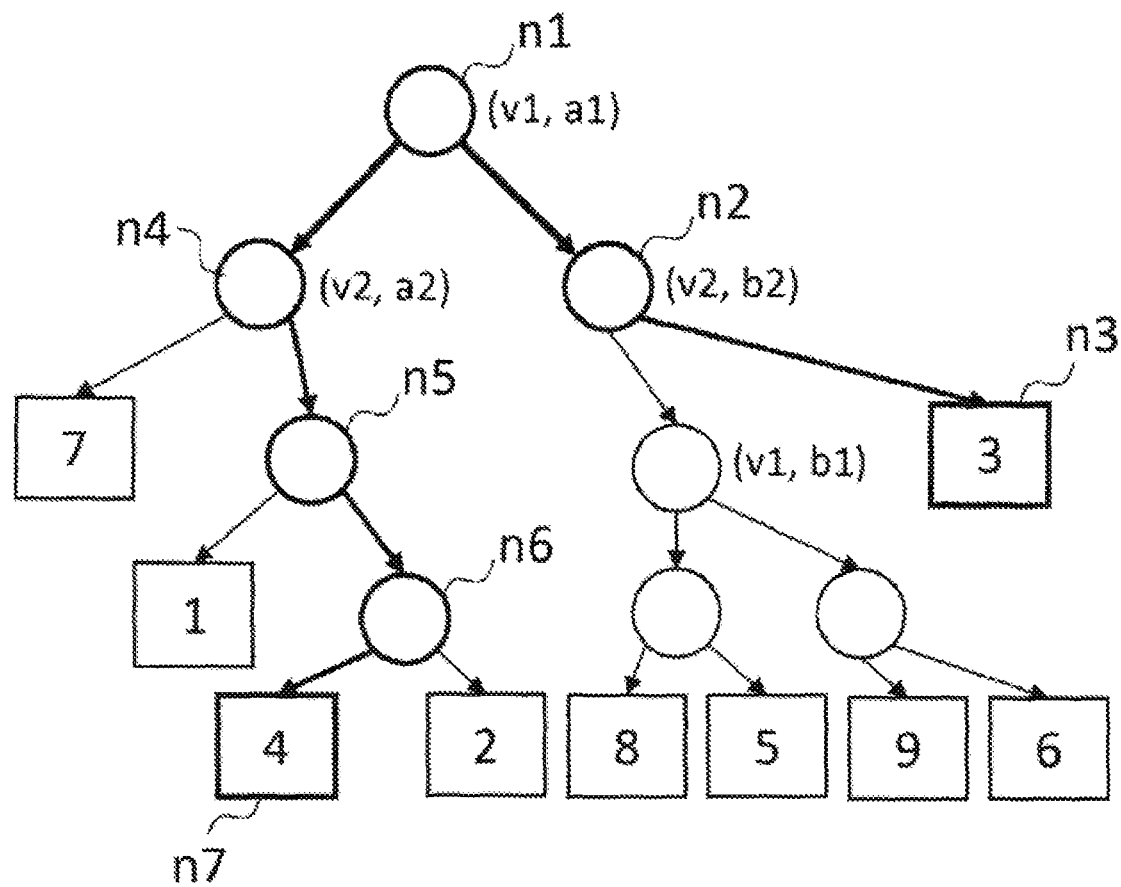
FIG. 11 is a diagram illustrating a binary tree corresponding to FIG. 10, according to at least one embodiment.

FIG. 9 is a flowchart illustrating an example of representative point search processing performed by the controller 200, and FIGS. 10 and 11 are diagrams schematically illustrating a processing sequence of the flowchart of FIG. 9. The flowchart of FIG. 9 is applicable to a case in which an n-dimensional (n is an integer of 2 or greater) multidimensional space is divided into a plurality of regions, and FIG. 10 illustrates an example in which a two-dimensional space is divided into a plurality of regions for the sake of simplification in the same manner as in FIGS. 5 and 7. FIG. 11 is a diagram illustrating a binary tree corresponding to FIG. 10.

As can be seen by comparing FIG. 10 with FIG. 7, in the representative point search processing of FIG. 9, when determining whether the first read level vd is the right side or the left side of a division boundary of each axis, the voltage margin M is set at the division boundary.

Hereinafter, the processing sequence of the flowchart of FIG. 9 will be described with reference to FIG. 10. The flowchart of FIG. 9 is divided into a first search processing of steps S1 to S5 and a second search processing of step S6 and subsequent steps. As described above, in the first search processing, determination processing is performed by setting the voltage margin M in the division boundary when determining whether the first read level vd is the right side or the left side of the division boundary of each axis. By setting the voltage margin M, determination criteria can be changed. The second search processing is performed when the first read level vd is located within a range of the voltage margin M, and searching is made according to an algorithm called a so-called depth-first search. In the second search processing, nodes becoming a search target are stored in a data structure called a stack (node storing unit), and all nodes located at a lower layer from the current node are searched until the stack becomes empty.

In the first search processing, whether or not the first read level vd is a voltage level having no division boundary, that is, a leaf node is determined (step S1). If the first read level is a leaf node, an entry number of the leaf node is selected, and the processing of FIG. 10 ends.

If it is determined in step S1 that the node is not a leaf node, the first read level vd is compared with a division boundary in consideration of the voltage margin M (step S2). In the step S2, when the first read level vd is lower than a voltage level of the division boundary even if the voltage margin M is taken into consideration, the processing proceeds to the node on the left side (step S3), and when the first read level vd is higher than the voltage level of the division boundary even if the voltage margin M is taken into consideration, the processing proceeds to the node on the right side (step S4). A condition for performing the processing of step S3 is when vd>boundaryPoint+M is satisfied. A condition for performing the processing of step S4 is when vd<boundaryPoint−M is satisfied. Here, boundaryPoint is a voltage level of the division boundary.

If the first read level vd is within a range of the voltage margin M, the first search processing stops and the second search processing after step S6 is selected (step S5).

The controller 200 may change a value of the voltage margin M according to a bit error rate. For example, the voltage margin M may be increased when the bit error rate is high, and the voltage margin M may be decreased when the bit error rate is low. The smaller the voltage margin M, the less frequently the second search processing is performed. Thus, the search processing for determining the entry number can be performed quickly.

In steps S3 and S4, the search processing is continued until the leaf node is reached while moving between the nodes on the lower layer side according to the binary tree by the method described with reference to FIGS. 5 to 8. When the leaf node is reached, an entry number of the leaf node is correlated with the first read level vd.

In the second search processing, among the nodes connected to the current node, the node becoming a search target is pushed in a data structure called a stack (step S6), and a sequence of popping out in order the nodes pushed in the stack from the node finally pushed in the stack is repeated until the stack becomes empty (steps S7 and S8). Thereby, it is possible to search all nodes becoming a search target on the lower layer side of the binary tree than the current node (steps S9 to S14). In this sequence, when the leaf node is reached, that is, when the node popped out from the stack is a leaf node (YES in step S9), the codebook is referenced by using the entry number of the leaf node to select the corresponding representative point and an Euclidean distance between the first read level vd and the representative point is calculated (step S14).

When the node popped out from the stack is a branch node, whether or not each of the two connected child nodes is in the search target is determined (steps S10 to S13). At this time, if the read level vd of a divided dimension d is smaller than the division boundary, the left node is in the search target (steps S12 and S13), and if the read level vd is higher than the division boundary, the right node is in the search target (steps S10 and S11). Further, when a distance from the division boundary is within the voltage margin M, both right and left nodes are in the search target. In step S10, it is determined to search the right when vd≥boundaryPoint−M is satisfied. Further, in step S12, it is determined to search the left when vd≤boundaryPoint+M is satisfied.

A value of the voltage margin M in the second search processing may be the same as or different from the value of the voltage margin M in the first search processing. Further, the voltage margin M may be the same or different in all the nodes in the binary tree.

In the second search processing, when the stack becomes empty (YES in step S7), the leaf node having the smallest Euclidean distance is selected (step S15), the codebook is reference by using an entry number of the leaf node to select the corresponding representative point.

In the above description, an example in which the first read level vd is assigned to one of the representative points of a plurality of regions obtained by dividing the two-dimensional space for each axis of each dimension is described, and in the QLC for writing 4-bit data to memory cells, when, for example, 255 representative points are provided as candidates for the read level vd, for example, 255 representative points of a region obtained by dividing a multidimensional space, which is a 15-dimensional space, for each dimension axis need to be prepared.

There is a possibility that the read levels vd of the QLC are not evenly scattered in the 15-dimensional space and are unevenly scattered. Therefore, the number of divisions may be different for each axis of each dimension of the 15-dimensional space. How to divide the 15-dimensional space is determined by a dedicated algorithm whose description is omitted in the present specification, and the controller 200 performs the processing of the flowchart of FIG. 9 according to the determined dividing method to search the representative point of the first read level vd.

When dividing the 15-dimensional space into a plurality of regions, it is assumed in at least one embodiment that the 15-dimensional space is divided by hyperplanes. Being divided by the hyperplanes means that an n-dimensional space is divided into two n-dimensional subspaces by a flat subspace of an n−1 dimension. When the two-dimensional space is divided into a plurality of regions along an axis of each dimension, the hyperplane becomes a straight line as illustrated in FIG. 5.

As such, in the first embodiment, when determining whether the first read level vd is on the right side or the left side of the division boundary, the voltage margin M is provided for the determination, and thus, it is possible to prevent a possibility that an erroneous determination is made due to noise superimposed on the read level vd near the division boundary, and to reduce a probability that an erroneous leaf node is finally selected.

In the search method according to the first embodiment, a distance from the first read level vd is not necessarily calculated for all leaf nodes, and thus, a calculation cost can be reduced as compared with a case of performing the total search by narrowing down the number of leaf nodes for which distance calculation is performed.

In the above description, an example in which the Euclidean distance is calculated when calculating a distance between the first read level vd and the representative point of the leaf node is described, and a Manhattan distance or a Chebyshev distance may be calculated, for example. The Euclidean distance is a value obtained by calculating a square root by adding the square of a difference between distances of the respective coordinates. The Manhattan distance indicates that the sum of absolute values of the differences between the coordinates is set as the distance between two points. The Chebyshev distance indicates that the maximum absolute value of the differences between the coordinates is set as the distance between two points.

Second Embodiment

In the first embodiment, an example in which, when an axis of each dimension of a multidimensional space is divided, the axis is divided by hyperplanes perpendicular to the axis, is described, and the axis may be divided by hyperplanes extending in a direction inclined to the axis. Such division can be performed by a linear classifier such as a linear support vector machine (SVM).

In this case, each branch node has information such as a node number, a coefficient parameter of a linear classifier, a determination boundary value of an output of the linear classifier, a node number of a case (right side) in which when the output of the linear classifier is larger than or equal to a determination boundary value, and a node number of a case (left side) in which the output of the linear classifier is smaller than the determination boundary value. The information stored in the leaf node is the same as in the first embodiment.

Instead of making two kinds of determinations of whether an output of a linear classifier is larger or smaller than a determination boundary value, a margin is added to the determination, and when the determination is ambiguous because an output of the linear classifier is close to the determination boundary value, search by the second search processing may be performed in the same manner as in the first embodiment. In the second search processing, an Euclidean distance between an input vector and a leaf node in a node set of a search target is calculated, an entry number with the smallest Euclidean distance is returned. Thus, data can be compressed by vector quantization.

As such, in the second embodiment, the first read level vd can be correlated with a representative point of a plurality of regions obtained by dividing a multidimensional space by using hyperplanes extending in a random direction with respect to an axis of each dimension.

Aspects of the present disclosure are not limited to the individual embodiments described above and include various modifications that can be derived by those skilled in the art, and the effects of the present disclosure are also not limited to the content described above. That is, various additions, changes, and partial removals may be made without departing from a conceptual idea and gist of the present disclosure derived from the content defined in the claims and the equivalents thereof.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a non-volatile memory including a word line and a plurality of memory cells connected to the word line; and
a controller configured to:
divide an n-dimensional space into a plurality of regions by a plurality of hyperplanes, where n is an integer of 2 or more;
assign a representative point of a read level for reading data from a plurality of memory cells to each region;
provide a binary tree for selecting any of the plurality of regions;
trace a branch node in the binary tree by determining whether a first read level is higher or lower than a voltage level at the branch node of the binary tree;
when determining the first read level is higher or lower than the voltage level of the branch node in the binary tree, determine whether a voltage difference between the first read level and the voltage level of the branch node is within a voltage margin or not;
when reaching the leaf node of the binary tree by tracing the branch node in the binary tree, determine a read level of a representative point assigned to a region correlated with a leaf node among the plurality of divided regions as a second read level corresponding to the first read level, and
cause the non-volatile memory to read data of the plurality of memory cells by applying a voltage of the determined second read level to the word line.

2. The memory system according to claim 1, wherein the controller is configured to adjust a voltage width of the voltage margin according to a bit error rate when reading data from the non-volatile memory.

3. The memory system according to claim 1, wherein the controller is configured to:
when the first read level exceeds the range of the voltage margin to be higher or lower than the voltage level of the branch node, repeat processing for comparing the first read level with the voltage level of the branch node in descending order from the branch node on an upper side according to the binary tree, and
when reaching the leaf node of the binary tree, determine the read level of the representative point assigned to the region correlated with the leaf node as the second read level.

4. The memory system according to claim 1, wherein the controller is configured to:
when it is determined that a voltage difference between the first read level and the voltage level of the branch node is within the voltage margin, perform comparison with the first read level for all branch nodes on a lower side of the binary tree from the branch node determined to be within the voltage margin.

5. The memory system according to claim 4, further comprising:
a node storage configured to store the branch node each time a branch node of a new search target is searched according to the binary tree,
wherein the controller is configured to perform a voltage comparison with the first read level in order from the branch node stored most recently among the branch nodes stored in the node storage.

6. The memory system according to claim 5,
wherein the controller is configured to perform the voltage comparison with the first read level in order from the branch node stored most recently until there are no branch nodes stored in the node storage.

7. The memory system according to claim 5,
wherein the controller is configured to:
when performing the voltage comparison of a voltage level of the branch node stored in the node storage with the first read level, determine whether the first read level is (i) higher or lower than the voltage level at the branch node, or (ii) within a range of the voltage margin corresponding to the voltage level of the branch node.

8. The memory system according to claim 4,
wherein the controller is configured to:
when the leaf node in the binary tree is searched, calculate a distance between the representative point in a region corresponding to the leaf node and the first read level and determine a read level of a representative point of a leaf node having a smallest distance as the second read level.

9. The memory system according to claim 8,
wherein the controller is configured to:
when calculating a distance between the first read level and the representative point, calculate a Euclidean distance, a Manhattan distance or a Chebyshev distance.

10. The memory system according to claim 4,
wherein the controller is configured to stop searching from the branch node to a branch node on a lower side of the binary tree for a branch node having the voltage difference when the first read level is higher than or equal to a predetermined value.

11. The memory system according to claim 1,
wherein the n-dimensional space is divided by a hyperplane perpendicular to an axis of each dimension.

12. The memory system according to claim 1,
wherein the n-dimensional space is divided by a hyperplane in a direction inclined from an axis of each dimension.

13. The memory system according to claim 12,
wherein the hyperplane is represented by a linear equation of the voltage level.

14. The memory system according to claim 1,
wherein the first read level is a read voltage determined by shift read or Vth tracking performed by the controller.

15. A method of operating a memory system comprising a non-volatile memory including a word line and a plurality of memory cells connected to the word line, the method comprising:
dividing an n-dimensional space into a plurality of regions by a plurality of hyperplanes, where n is an integer of 2 or more;
assigning a representative point of a read level for reading data from a plurality of memory cells to each region;

providing a binary tree for selecting any of the plurality of regions;

tracing a branch node in the binary tree by determining whether a first read level is higher or lower than a voltage level at the branch node of the binary tree;

when determining the first read level is higher or lower than the voltage level of the branch node in the binary tree, determining whether a voltage difference between the first read level and the voltage level of the branch node is within a voltage margin or not;

when reaching the leaf node of the binary tree by tracing the branch node in the binary tree, determining a read level of a representative point assigned to a region correlated with a leaf node among the plurality of divided regions as a second read level corresponding to the first read level, and causing the non-volatile memory to read data of the plurality of memory cells by applying a voltage of the determined second read level to the word line.

16. The method according to claim 15, further comprising:

adjusting a voltage width of the voltage margin according to a bit error rate when reading data from the non-volatile memory.

17. The method according to claim 15, further comprising:

when the first read level exceeds the range of the voltage margin to be higher or lower than the voltage level of the branch node, repeating processing for comparing the first read level with the voltage level of the branch node in descending order from the branch node on an upper side according to the binary tree, and when reaching the leaf node of the binary tree, determining the read level of the representative point assigned to the region correlated with the leaf node as the second read level.

18. The method according to claim 15, further comprising:

when it is determined that a voltage difference between the first read level and the voltage level of the branch node is within the voltage margin, performing comparison with the first read level for all branch nodes on a lower side of the binary tree from the branch node determined to be within the voltage margin.

19. The method according to claim 18, further comprising:

storing the branch node each time a branch node of a new search target is searched according to the binary tree, and performing a voltage comparison with the first read level in order from the branch node stored most recently among the branch nodes stored.

20. The method according to claim 19, further comprising:

performing the voltage comparison with the first read level in order from the branch node stored most recently until there are no branch nodes stored.

* * * * *